(12) United States Patent
Fan et al.

(10) Patent No.: US 9,570,573 B1
(45) Date of Patent: Feb. 14, 2017

(54) SELF-ALIGNED GATE TIE-DOWN CONTACTS WITH SELECTIVE ETCH STOP LINER

(71) Applicant: GLOBALFOUNDRIES, INC., Grand Cayman (KY)

(72) Inventors: Su Chen Fan, Cohoes, NY (US); Lars W. Liebmann, Poughquag, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/822,490

(22) Filed: Aug. 10, 2015

(51) Int. Cl.
- *H01L 29/45* (2006.01)
- *H01L 21/768* (2006.01)
- *H01L 29/66* (2006.01)
- *H01L 21/3105* (2006.01)

(52) U.S. Cl.
CPC ......... *H01L 29/45* (2013.01); *H01L 21/31053* (2013.01); *H01L 21/31058* (2013.01); *H01L 21/76804* (2013.01); *H01L 21/76831* (2013.01); *H01L 21/76897* (2013.01); *H01L 29/6653* (2013.01)

(58) Field of Classification Search
CPC .... H01L 21/768; H01L 23/522; H01L 23/528; H01L 27/088
USPC .................. 257/774, 288; 438/242, 243, 270
See application file for complete search history.

(56) References Cited

U.S. PATENT DOCUMENTS

| | | | |
|---|---|---|---|
| 5,006,911 A | 4/1991 | Sivan | |
| 5,217,567 A | 6/1993 | Cote et al. | |
| 5,668,052 A * | 9/1997 | Matsumoto et al. | 438/624 |
| 6,107,189 A | 8/2000 | Wald et al. | |
| 6,348,411 B1 | 2/2002 | Ireland et al. | |
| 6,660,581 B1 * | 12/2003 | Yang et al. | 438/242 |
| 7,037,845 B2 | 5/2006 | Brask et al. | |
| 7,718,513 B2 | 5/2010 | Zhu et al. | |
| 7,813,162 B2 | 10/2010 | Zhu et al. | |
| 8,802,520 B2 | 8/2014 | Tang et al. | |
| 2012/0273901 A1 * | 11/2012 | Yin et al. | 257/410 |

(Continued)

OTHER PUBLICATIONS

Anonymous, "SRAM memory interface to microcontroller in embedded systems," EE Herald, Retrieved May 2015. (pp. 1-8). Available at http://www.eeherald.com/section/design-guide/esmod15.html.

(Continued)

*Primary Examiner* — Sheng Zhu
(74) *Attorney, Agent, or Firm* — David Cain; Hoffman Warnick, LLC

(57) ABSTRACT

A method for forming a gate tie-down includes exposing an active area to form trench contact openings and forming trench contacts therein. An etch stop layer is formed on the trench contacts and on spacers of adjacent gate structures. An interlevel dielectric (ILD) is deposited to fill over the etch stop layer. The ILD and the etch stop layer on one side of the gate structure are opened up to provide an exposed etch stop layer portion. The gate structure is recessed to expose a gate conductor. The exposed etch stop layer portion is removed. A conductive material is deposited to provide a self-aligned contact down to the trench contact on the one side of the gate structure, to form a gate contact down to the gate conductor and to form a horizontal connection within the ILD over the active area between the gate conductor and the self-aligned contact.

14 Claims, 7 Drawing Sheets

(56) References Cited

U.S. PATENT DOCUMENTS

2014/0197468 A1* 7/2014 Xie et al. .................. 257/288
2015/0235948 A1* 8/2015 Song et al. ................ 257/774

OTHER PUBLICATIONS

Carmona, M. et al., "Study of gate contact over active area," 29th Symposium on Microelectronics Technology and Devices (SBMicro), Sep. 2014. (pp. 1-4).
Mishra, P. et al., "FinFET Circuit Design," Nanoelectronic Circuit Design, Nov. 2011. (pp. 23-54).
Shin, C., "Advanced MOSFET Designs and Implications for SRAM Scaling," Dissertation for the degree of Doctor of Philosophy in Engineering—Electrical Engineering and Computer Sciences at University of California, Berkeley, Spring 2011. (pp. 1-109).

* cited by examiner

US 9,570,573 B1

SELF-ALIGNED GATE TIE-DOWN CONTACTS WITH SELECTIVE ETCH STOP LINER

BACKGROUND

Technical Field

The present invention relates to semiconductor processing, and more particularly to a gate tie-down structure that permits gate contacts in active areas and reduces shorts between adjacent contacts and gate conductors.

Description of the Related Art

In conventional complementary metal oxide semiconductor (CMOS) processing, gate contacts are formed over shallow trench isolation (STI) regions. Gate contacts connect a gate line to upper metal layers in device designs. In many instances, providing the gate contacts in STI regions can result in a large amount of chip area being lost.

Gate tie-down structures or regions provide a connection between the gate contact and a source/drain (S/D) region contact. The formation of a gate tie-down structure may result in shorts between a silicide region of the S/D region or with conductive material of an adjacent gate. This is due, in part, to the small margins of dielectric materials between these structures and the close proximity of the conductive bodies.

SUMMARY

A method for forming a gate tie-down includes exposing an active area by etching dielectric material on adjacent sides of a gate structure to open up trench contact openings; forming trench contacts in the trench contact openings and forming an etch stop layer on the trench contacts and on spacers of gate structures adjacent to the trench contacts. An interlevel dielectric (ILD) is deposited to fill over the etch stop layer in the trench contact openings and over the gate structures adjacent to the trench contacts. The ILD and the etch stop layer on one side of the gate structure are opened up to provide an exposed etch stop layer portion. The gate structure is recessed to remove a cap layer, recess one spacer and expose a gate conductor. The exposed etch stop layer portion is removed. A conductive material is deposited to provide a self-aligned contact down to the trench contact on the one side of the gate structure, to form a gate contact down to the gate conductor and to form a horizontal connection within the ILD over the active area between the gate conductor and the self-aligned contact.

Another method for forming a gate tie-down includes exposing an active area by etching dielectric material on adjacent sides of a gate structure to open up trench contact openings; depositing a first conductive material in the trench contact openings; recessing the first conductive material to form trench contacts in the trench contact openings; conformally depositing an etch stop layer on the dielectric material, on the trench contacts and on spacers of gate structures adjacent to the trench contacts; forming a planarizing material over the etch stop layer; planarizing to remove the planarizing material and the etch stop layer from a top surface; removing the planarizing material from etch stop portions formed on the trench contacts; depositing an interlevel dielectric (ILD) to fill over the etch stop portions and over the gate structures adjacent to the trench contacts; opening up the ILD and the etch stop portion on one side of the gate structure to provide an exposed etch stop layer portion; recessing the gate structure to remove a cap layer, recess one spacer and expose a gate conductor; removing the exposed etch stop layer portion; and depositing a second conductive material to provide a self-aligned contact down to the trench contact on the one side of the gate structure, to form a gate contact down to the gate conductor and to form a horizontal connection within the ILD over the active area between the gate conductor and the self-aligned contact.

A gate tie-down structure includes a gate structure including a gate conductor and gate spacers, trench contacts formed on sides of the gate structure and an etch stop layer portion formed on a gate spacer on one side of the gate structure and over the trench contact on the one side of the gate structure. A first interlevel dielectric (ILD) is configured to bury the gate structure, and a second interlevel dielectric (ILD) has a thickness and is formed on the first ILD and over the etch stop layer portion. A self-aligned contact connects to the trench contact on the other side of the gate structure. A gate contact is connected to the gate conductor. A horizontal connection within the thickness of the second ILD is formed over an active area and connects the gate conductor and the self-aligned contact over a gate spacer formed on the other side of the gate structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
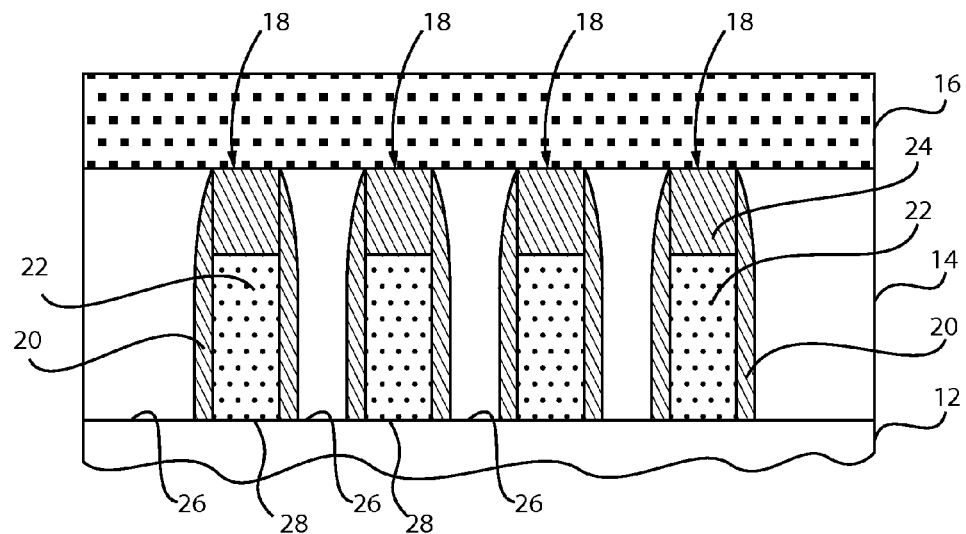
FIG. 1 is a cross-sectional view of a semiconductor device having gate structures formed in an interlevel dielectric (ILD) in accordance with the present principles.

In accordance with the present principles, a gate tie-down structure and methods for fabrication are provided. The gate tie-down provides a gate contact (CB) that is able to short against a self-aligned contact (CA) without shorting against a trench silicide (TS) contact. The gate contact provides a connection to a gate conductor (PC) of a gate structure employed in a transistor device. The gate conductor in some instances may be connected to a source or drain region. This is referred to as a gate tie-down. Gate tie-downs in accordance with the present principles may be provided over active regions without suffering from the shorting issues of conventional structures.

The present principles provide methods and structures for forming gate-tie-downs with an etch stop layer, e.g., high-k dielectric, to encapsulate source/drain contacts. This etch stop layer prevents breakthrough into adjacent gate conductors. In addition, the gate tie-downs include a gate contact that is self-aligned to a source/drain contact. The tie-down structure provides a gate contact that can "fly" over the source/drain contact making the design more compact saving precious chip area. For example, the gate tie-down structure can be allowed on or over active areas (AA). The gate contact structure enables the gate contact to fly over a source/drain contact to reduce a layout footprint. The gate tie-down structure may be employed in memory devices, e.g., static random access memory (SRAM), processors, or other chip devices.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may be included in an integrated circuit or integrated circuit design. A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This may be extended, as readily apparent by one of ordinary skill in this and related arts, for as many items listed.

Referring now to the drawings in which like numerals represent the same or similar elements and initially to FIG. 1, a cross-sectional view of a partially fabricated semiconductor device 10 is shown in accordance with the present principles. The device 10 is formed on a substrate 12, which may include any suitable substrate materials, such as Si, SiGe, SiC, III-V materials, etc. Gate structures 18 are formed on the substrate 12 and may include source/drain (S/D) regions 26 adjacent to the gate structures 18. The gate structures 18 may include a gate dielectric 28 (e.g., an oxide) and a gate conductor 22, which may include a metal, doped polysilicon or other suitable gate conductor material. Spacers 20 are formed on sidewalls of the gate conductor 22, and a cap layer 24 is formed over the gate conductor 22. The spacers 20 and the cap 24 may include a silicon nitride material, although other dielectric materials may be employed. Gate structures 18 are buried in an interlevel dielectric (ILD) material 14, such as an oxide. Another ILD 16 is formed over the gate structures 18 and on the first ILD 14. The ILD 16 may also include an oxide.

Figure 2:
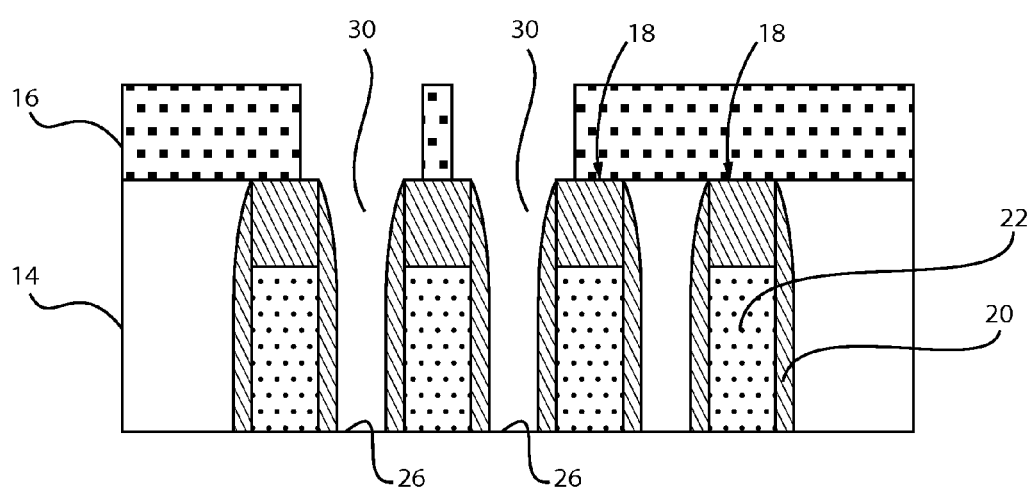
FIG. 2 is a cross-sectional view of the semiconductor device of FIG. 1 having trench contact openings formed adjacent to a gate structure to expose an active area in accordance with the present principles.

Referring to FIG. 2, recesses or trenches 30 are etched through the ILD 14 and ILD 16 for selected gate structures 18. The recesses 30 are formed to gain access to the S/D regions 26 adjacent to the spacers 20 of the gate structures 18. The recesses 30 are formed by performing a lithographic patterning process followed by an etch process to open the recesses 30 and expose the S/D regions 26. The etch process may include a reactive ion etch (RIE) selective to the cap layer 24 and spacers 20 (e.g., nitride material) of the gate structures 18. The recesses 30 allow for a self-aligned contact to be provided as will be described.

Figure 3:
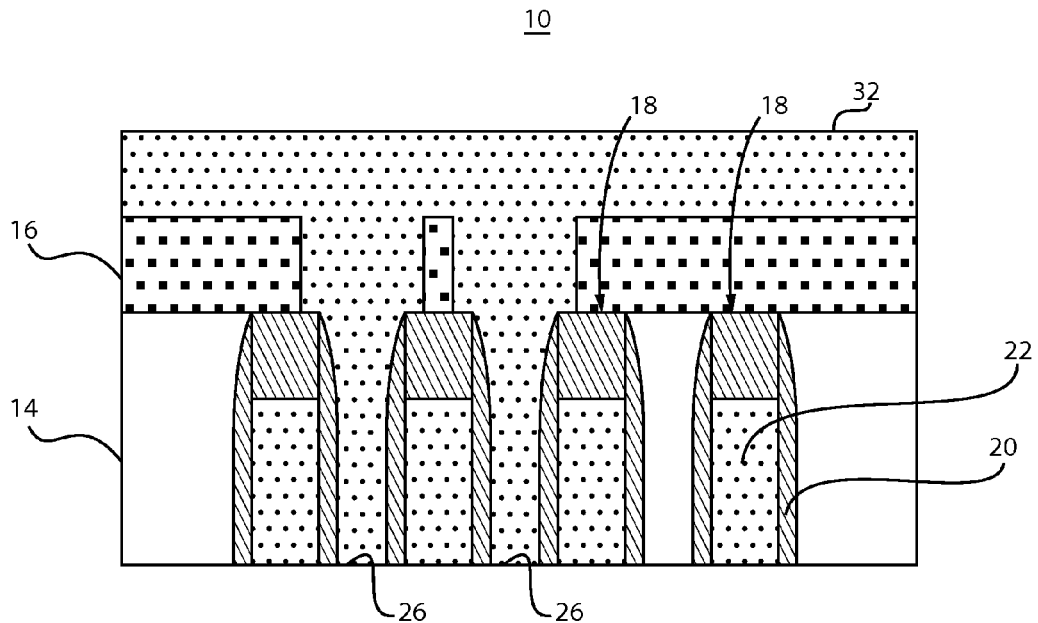
FIG. 3 is a cross-sectional view of the semiconductor device of FIG. 2 showing a conductive material formed in the trench openings in accordance with the present principles.

Referring to FIG. 3, a deposition process is performed to fill trenches 30 between spacers 20 of adjacent gate structures 18 and over the ILD 16 with a conductive material 32. The deposition process may include a chemical vapor deposition (CVD) process although other deposition processes may be employed. The conductive material 32 may include W, although other metals may be employed, e.g., Al, Cu, Ag, etc. The conductive material 32 connects to the S/D regions 26. The conductive material 32 preferably includes the same materials as the gate conductors 22.

Figure 4:
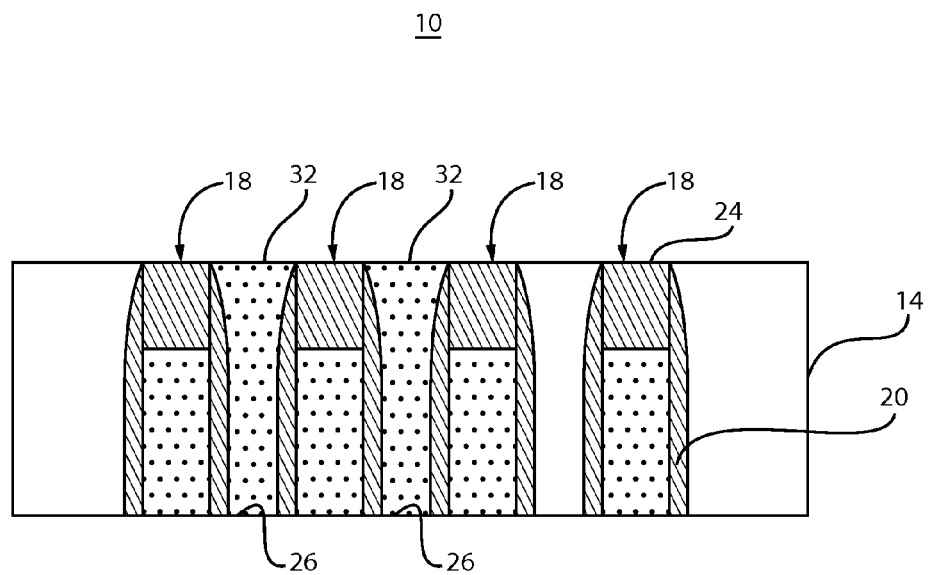
FIG. 4 is a cross-sectional view of the semiconductor device of FIG. 3 showing the conductive material planarized in accordance with the present principles.

Referring to FIG. 4, a planarization process is performed to planarize a top surface of the device 10 to remove excess conductive material 32. The planarization process may include a chemical mechanical polish (CMP) process. The planarization process removes the ILD 16 down to the cap layer 24.

Figure 5:
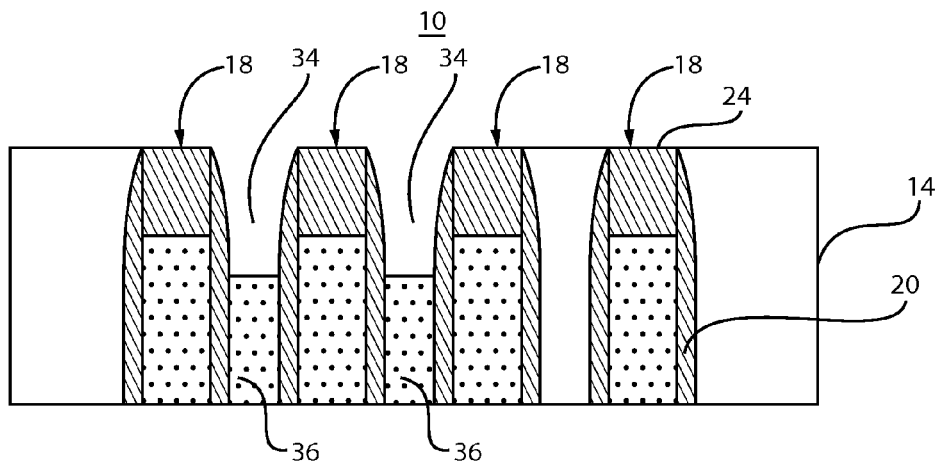
FIG. 5 is a cross-sectional view of the semiconductor device of FIG. 4 showing the conductive material recessed to form trench contacts in accordance with the present principles.

Referring to FIG. 5, a recess process is performed to recess the conductive material 32 to a position along the spacers 20. The recess process may include a RIE process that selectively removes the conductive material 32 relative to the ILD 14, the spacers 20 and the cap layer 24. In one embodiment, the ILD 14 includes oxide, and the spacers 20 and cap layer 24 include nitride. Recessing the conductive material 32 forms trench silicide (TS) contacts 36, which contact the S/D regions 26 (also called S/D contacts). The recess process forms recesses 34.

Figure 6:
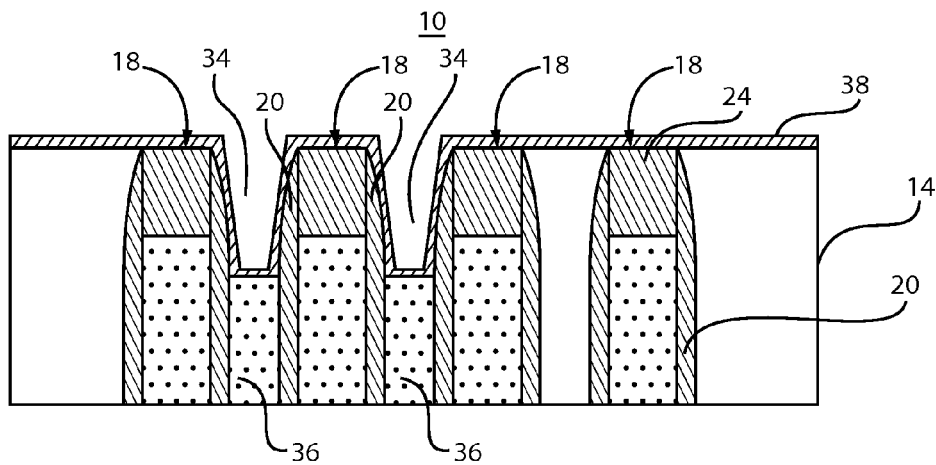
FIG. 6 is a cross-sectional view of the semiconductor device of FIG. 5 showing an etch stop layer conformally deposited in accordance with the present principles.

Referring to FIG. 6, an etch stop layer 38 is conformally formed on the ILD 14 and in the recesses 34 on the cap layer 24 and over the spacers 20 of the gate structure 18. The etch stop layer 38 may include a high selective etch stop layer (HS-ESL) and may include a high-k dielectric material, such as e.g., $HfO_2$, $AlO_2$, $Ta_2O_5$, etc., although other materials may be employed. The etch stop layer 38 preferably includes a selectivity greater than that of the cap layer 24 and the spacers 20 (e.g., greater than silicon nitride in one embodiment).

Figure 7:
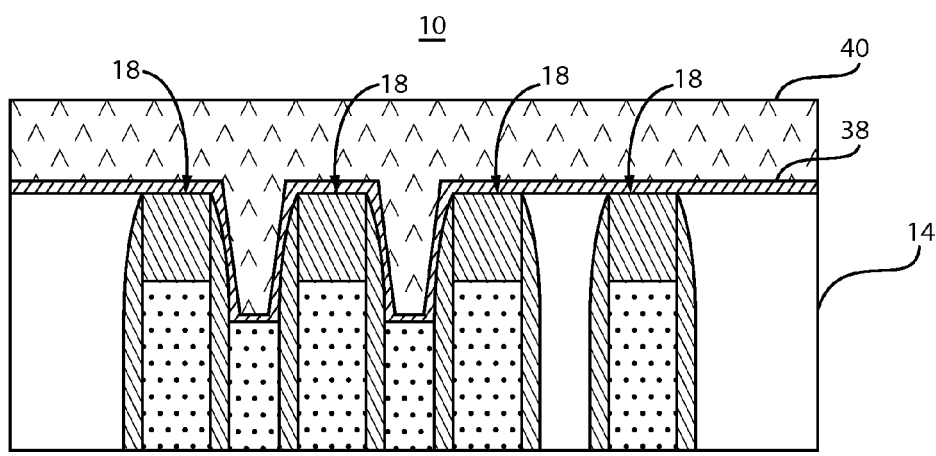
FIG. 7 is a cross-sectional view of the semiconductor device of FIG. 6 showing a planarizing material formed over the etch stop layer in accordance with the present principles.

Referring to FIG. 7, a spin-on or deposition process is performed to fill recesses 34 on the etch stop layer 38 on the gate structures 18 with a planarizing material 40. In one embodiment, the material 40 includes a spin-on organic dielectric material, such as, e.g., polyimide, polynorbornenes, benzocyclobutene or similar spin-on organic dielectric material.

Figure 8:
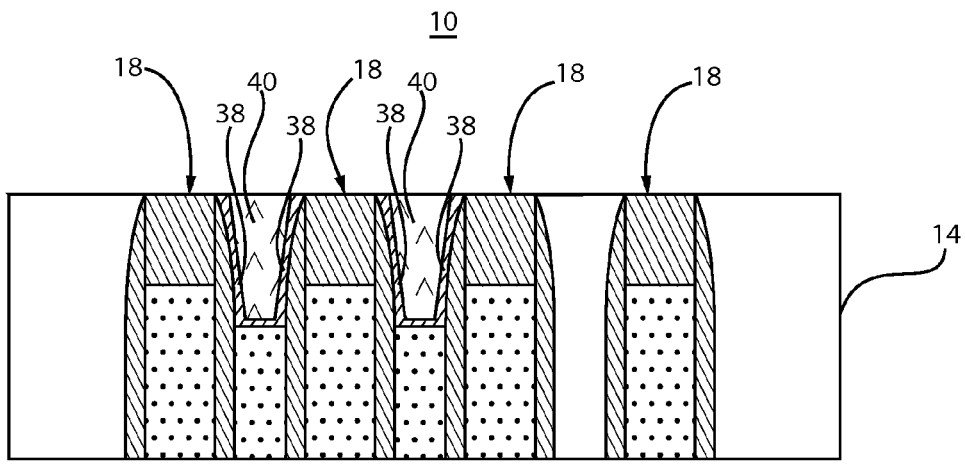
FIG. 8 is a cross-sectional view of the semiconductor device of FIG. 7 showing the planarizing material and the etch stop layer planarized in accordance with the present principles.

Referring to FIG. 8, a planarization process is performed to planarize a top surface of the device 10 to remove excess material 40 and etch stop layer 38 down to the cap layer 24. The planarization process may include a CMP process.

Figure 9:
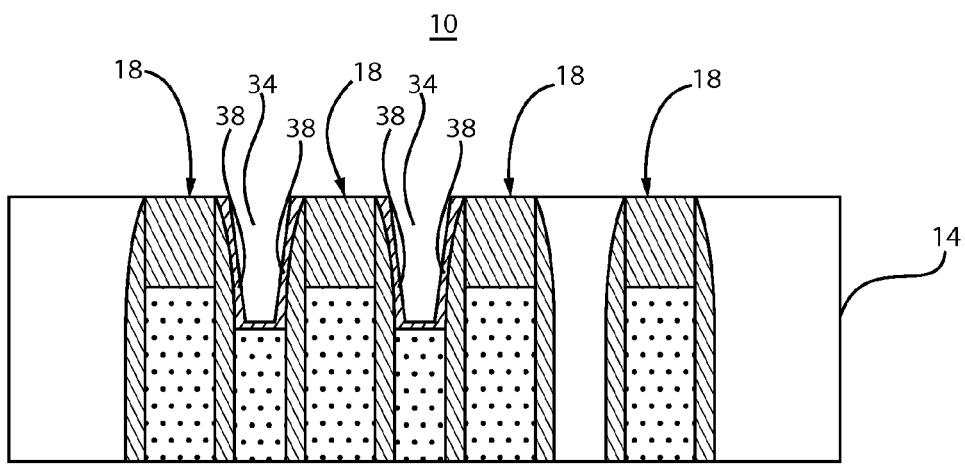
FIG. 9 is a cross-sectional view of the semiconductor device of FIG. 8 showing the planarizing material removed from etch stop layer portions in accordance with the present principles.

Referring to FIG. 9, a selective etch process may be performed to remove the material 40 from the etch stop layer 38 in the recesses 34. The etch process may include RIE, which is selective to the material of the cap layer 24, the ILD 14 and the etch stop layer 38.

Figure 10:
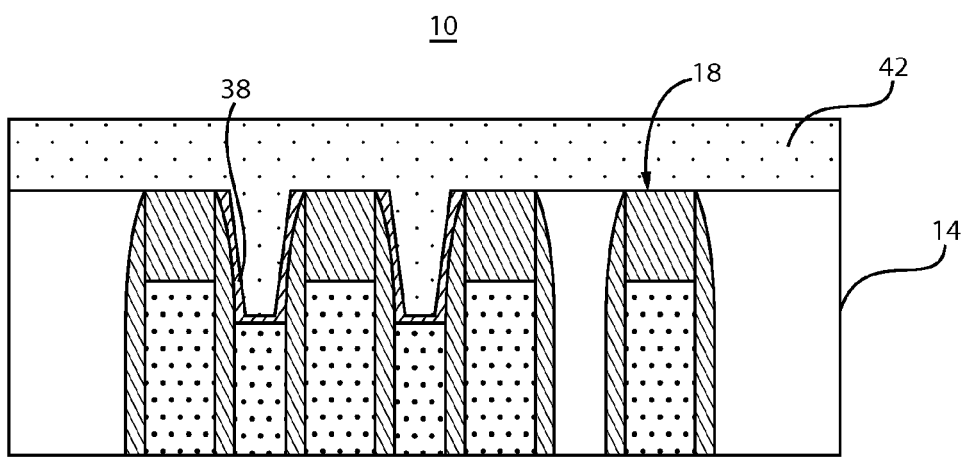
FIG. 10 is a cross-sectional view of the semiconductor device of FIG. 9 showing a top ILD formed on the etch stop layer portions and over the gate structures in accordance with the present principles.

Referring to FIG. 10, another ILD 42 is deposited on the device 10. The ILD 42 may include an oxide although other dielectric materials may be employed. The ILD 42 fills the recesses 34 and covers the cap layer 24 and the ILD 14.

Figure 11:
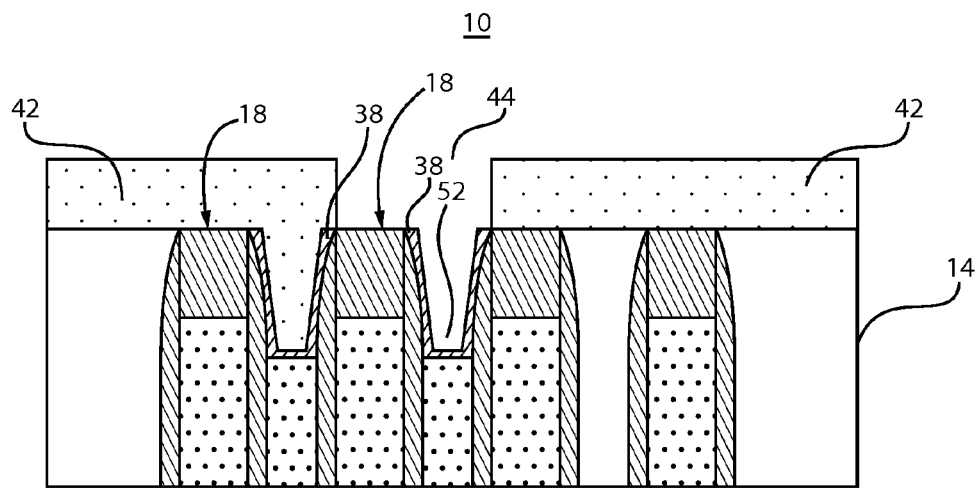
FIG. 11 is a cross-sectional view of the semiconductor device of FIG. 10 showing an open etch of the top ILD and the formation of a self-aligned contact opening in accordance with the present principles.

Referring to FIG. 11, a lithographic patterning process is employed to form an opening 44 through the ILD 42. Once patterned the ILD 42 is etched to remove material from opening 44 and within region 52. The etch process selectively removes the ILD material (e.g., oxide) with respect to the etch stop layer 38 and the cap layer 24. The etch process may include a RIE.

Figure 12:
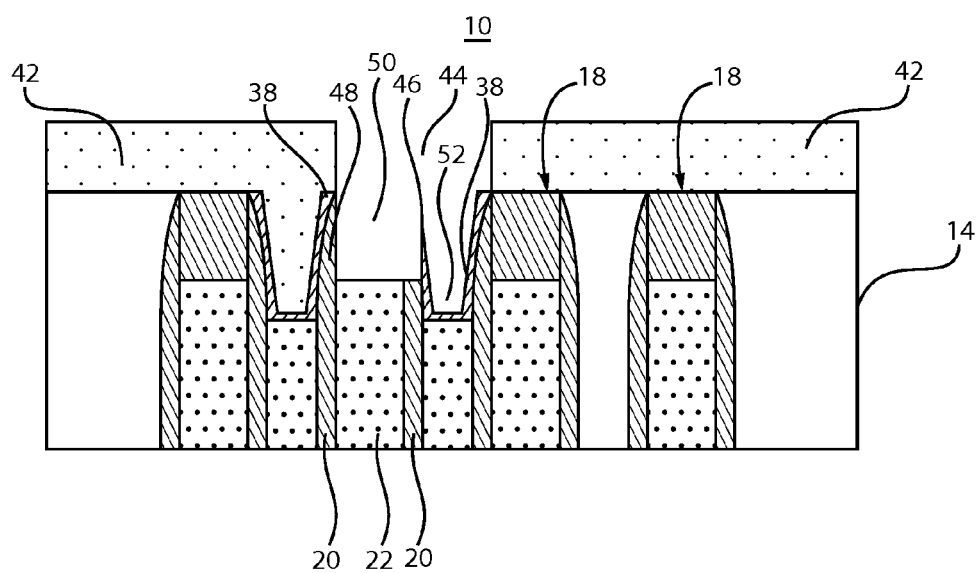
FIG. 12 is a cross-sectional view of the semiconductor device of FIG. 11 showing an etch of a gate contact opening in accordance with the present principles.

Referring to FIG. 12, another lithographic patterning process is employed to open the cap layer 24 to expose the gate conductor 22 and recess one spacer 20. The etch process removes the cap layer 24 and exposes a portion 48 of the other spacer 20 to form region 50. A portion 46 of the etch stop layer 38 may be thinned by the etching process. The etch process selectively removes the cap layer 24, spacer 20 relative to the ILD material 42 (e.g., oxide) and the etch stop layer 38. The etch process may include a directional RIE.

Figure 13:
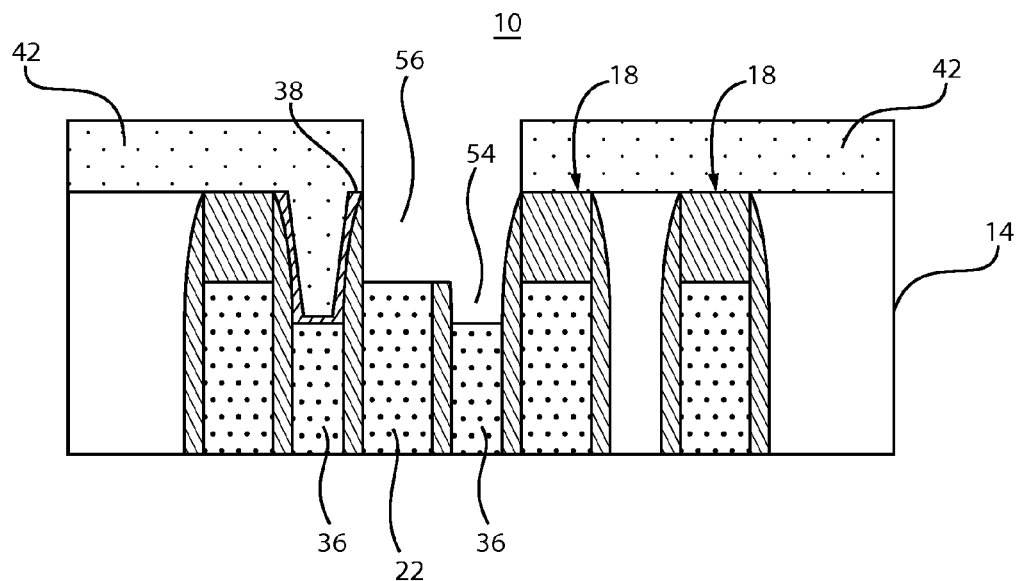
FIG. 13 is a cross-sectional view of the semiconductor device of FIG. 12 showing an etch stop portion removed in accordance with the present principles.

Referring to FIG. 13, another lithographic patterning process is employed to remove the exposed portion of the etch stop layer 38 selectively to the ILD 42, gate conductor 22 and spacers 20 (e.g., selective to oxide and nitride). With the etch stop layer 38 removed, a contact opening 54 is made for a self-aligned contact (CA) down to the TS contact 36. In addition, a contact opening 56 is made for a gate contact (CB).

Figure 14:
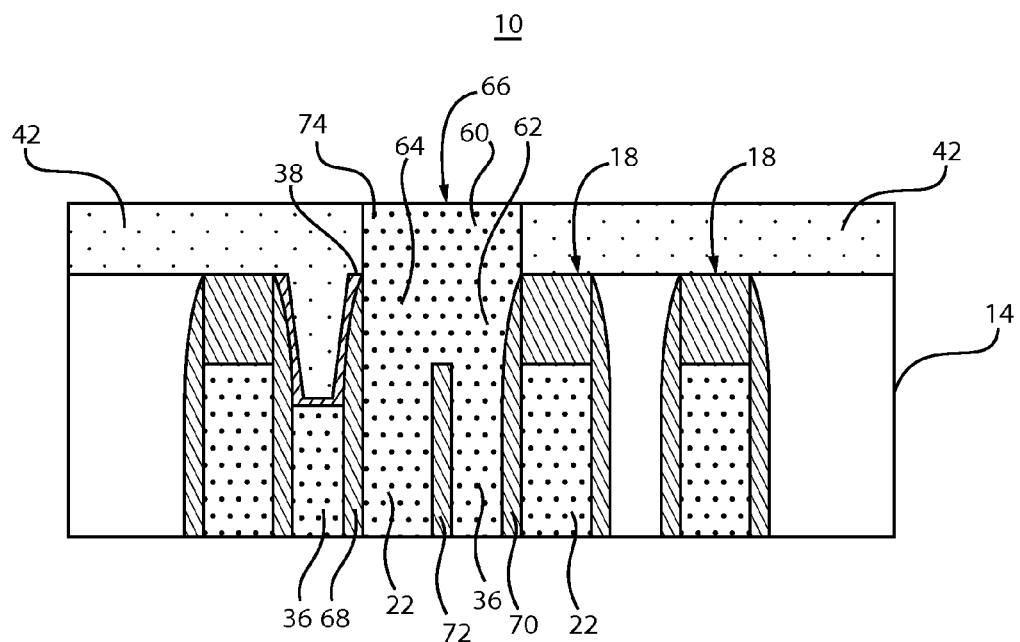
FIG. 14 is a cross-sectional view of the semiconductor device of FIG. 13 showing a conductive material deposition, and the conductive material and the top ILD planarized to form a gate tie-down structure with a gate contact, a connection (in the top ILD) and self-aligned contact in accordance with the present principles.

Referring to FIG. 14, a deposition process is performed to deposit a conductive material 60 to form gate contacts 64 (CB), self-aligned contacts 62 (CA), and a gate tie-down structure 66. The conductive material 60 preferably includes a same material as employed for TS contacts 36 and gate conductor 22. In one embodiment, the conductive material 60 includes W, although other metals may be employed. The conductive material 60 and the ILD 42 are planarized to recess the material 60 such that a portion of the conductive material 60 forms a connection 74 between the gate contact 64 and the contact 62 (that connects to the TS contact 36). The connection 74 is buried within a thickness of the ILD 42.

In accordance with the present principles, the gate tie-down structure 66 provides a self-aligned gate contact (CB) 64 that shorts directly to contact 62 (CA) and not directly to the TS contact 36. A spacer 68 along with the etch stop layer 38 prevents shorts between the adjacent contact 36 and the gate conductor 22. A spacer 70 prevents shorts between the adjacent contact 36 and the gate conductor 22 (shorts in this region occurred in conventional structures). A spacer 72 provides a dielectric barrier that prevents direct shorting between the gate contact 64 and the TS contact 36. In addition, the gate contact 64 is self-aligned with the self-aligned contact 36. The gate contact 64 is made within the active region (over S/D regions 26). This reduces the layout footprint of the device 10. In other words, a horizontal connection 74 is made directly between the gate contact 64 and the self-aligned contact 62 using vertical space provided by the ILD 42. This connection 74 is made without having to use layout area, which would normally be consumed by placing the connections over an STI region outside of the S/D regions (active area). The present principles may be implemented in 7 nm technology, although other technology sizes (larger or smaller may benefit from the present principles).

Figure 15:
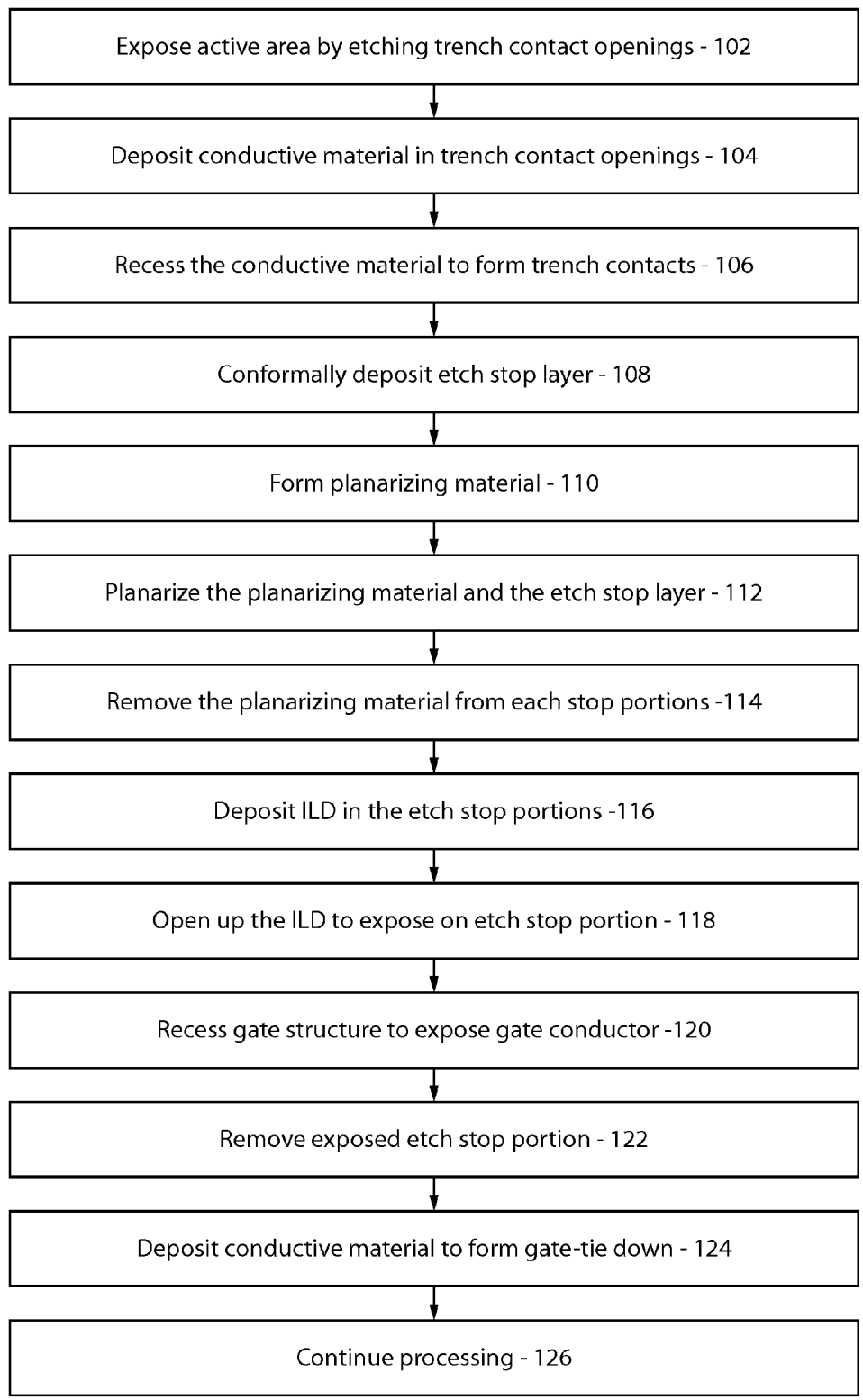
FIG. 15 is a block/flow diagram showing methods for forming a gate tie-down in accordance with the present principles.

Referring to FIG. 15, methods for forming a gate tie-down are shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, after gate structures and source and drain (S/D) regions are formed, an active area is exposed by etching dielectric material on adjacent sides of a gate structure to open up trench contact openings. In block 104, a conductive material is deposited in the trench contact openings. In block 106, the conductive material is recessed to form trench contacts in the trench contact openings. In block 108, an etch stop layer is conformally deposited on the dielectric material, on the trench contacts and on spacers of gate structures adjacent to the trench contacts. The etch stop layer may include a high-k dielectric material.

In block 110, a planarizing material is optionally formed over the etch stop layer. The planarizing material may include a spun on organic material. In block 112, planarizing material and the etch stop layer are planarized to remove them from a top surface. In block 114, the planarizing material is removed from etch stop portions formed on the trench contacts.

In block 116, an interlevel dielectric (ILD) is deposited to fill over the etch stop portions and over the gate structures adjacent to the trench contacts. In block 118, the ILD and the etch stop portion are opened up on one side of the gate structure to provide an exposed etch stop layer portion. In block 120, the gate structure is recessed to remove a cap layer, recess one spacer and expose a gate conductor. The recessed spacer remains to permit contact between a self-aligned contact and a gate contact (which will be formed) and to prevent contact between the trench contact and the gate conductor.

In block 122, the exposed etch stop layer portion is removed. In block 124, another conductive material is deposited to provide a self-aligned contact down to the trench contact on the one side of the gate structure, to form a gate contact down to the gate conductor and to form a horizontal connection within the ILD over the active area between the gate conductor and the self-aligned contact. The etch stop portion opposite the one side of the gate structure remains with a corresponding spacer of the gate structure to prevent shorts between one of the trench contacts and the gate conductor. The exposed etch stop layer portion prevents erosion of a spacer of an adjacent gate structure to prevent shorts between one of the trench contacts and a gate conductor of an adjacent gate structure. The ILD includes a thickness above the cap layer of the gate structures, and the horizontal connection between the gate conductor and the self-aligned contact is formed within the ILD thickness. In block 126, processing continues to complete the device.

Having described preferred embodiments for gate tie-down with a highly selective etch stop liner (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a gate tie-down, comprising:
exposing an active area by etching dielectric material on adjacent sides of a gate structure to pen up trench contact openings and forming trench contacts therein;
forming a etch stop layer on the trench contacts and on spacers of gate structures adjacent to the trench contact;
depositing an interlevel dielectric (ILD) to fill over the etch stop layer in the trench contact openings and over the gate structures adjacent to the trench contacts;
opening up the ILD and the etch top layer on one side of the gate structure to provide an exposed etch stop layer portion;
recessing the gate structure to remove a cap layer, recess one space and expose a gate conductor and removing the exposed etch stop layer portion; and
deposition a conductive material to provide a self-aligned contact down to the trench contact on the one side of the gate structure, to form a gate contact down to the gate conductor and to form a horizontal connection within the ILD over the active area between the gate conductor and the self-aligned contact.

2. The method as recited in claim 1, wherein the etch stop layer opposite the one side of the gate structure remains with a corresponding spacer of the gate structure to prevent shorts between one of the trench contacts and the gate conductor.

3. The method as recited in claim 1, wherein the exposed etch stop layer portion prevents erosion of a spacer of an adjacent gate structure to prevent shorts between one of the trench contacts and a gate conductor of an adjacent gate structure.

4. The method as recited in claim 1, wherein the ILD includes a thickness above the cap layer of the gate structures, and the horizontal connection between the gate conductor and the self-aligned contact is formed within the ILD thickness.

5. The method as recited in claim 1, wherein a gate spacer remains to permit contact between the self-aligned contact and the gate contact and to prevent contact between the trench contact and the gate conductor.

6. The method as recited in claim 1, wherein the etch stop layer includes a high-k dielectric material.

7. The method as recited in claim 1, wherein the recessing of the gate structure is performed after the opening up of the ILD and the etch stop layer.

8. A method for forming a gate tie-down, comprising:
exposing an active area by etching dielectric material on adjacent sides of a gate structure to open up trench contact openings;
depositing a first conductive material in the trench contact openings;
recessing the first conductive material to form trench contacts in the trench contact openings;
conformally depositing an etch stop layer on the dielectric material, on the trench contacts and on spacers of gate structures adjacent to the trench contacts;
forming a planarizing material over the etch stop layer;
planarizing to remove the planarizing material and the etch stop layer from a top surface;
removing the planarizing material from etch stop portions formed on the trench contacts;
depositing an interlevel dielectric (ILD) to fill over the etch stop portions and over the gate structures adjacent to the trench contacts;
opening up the ILD and the etch stop portion on one side of the gate structure to provide an exposed etch stop layer portion;
recessing the gate structure to remove a cap layer, recess one spacer and expose a gate conductor;
removing the exposed etch stop layer portion; and
depositing a second conductive material to provide a self-aligned contact down to the trench contact on the one side of the gate structure, to form a gate contact down to the gate conductor and to form a horizontal connection within the ILD over the active area between the gate conductor and the self-aligned contact.

9. The method as recited in claim 8, wherein the etch stop portion opposite the one side of the gate structure remains with a corresponding spacer of the gate structure to prevent shorts between one of the trench contacts and the gate conductor.

10. The method as recited in claim 8, wherein the exposed etch stop layer portion prevents erosion of a spacer of an adjacent gate structure to prevent shorts between one of the trench contacts and a gate conductor of an adjacent gate structure.

11. The method as recited in claim 8, wherein the ILD includes a thickness above the cap layer of the gate structures, and the horizontal connection between the gate conductor and the self-aligned contact is formed within the ILD thickness.

12. The method as recited in claim 8, wherein a gate spacer remains to permit contact between the self-aligned contact and the gate contact and to prevent contact between the trench contact and the gate conductor.

13. The method as recited in claim 8, wherein the etch stop layer includes a high-k dielectric material.

14. The method as recited in claim 8, wherein the planarizing material includes a spun on organic material.

* * * * *